United States Patent [19]

Wile

[11] Patent Number: 5,389,827

[45] Date of Patent: Feb. 14, 1995

[54] QUICK RECOVERY AC COUPLING CIRCUIT

[75] Inventor: Donald T. Wile, San Jose, Calif.

[73] Assignee: National Semiconductor Corporation, Santa Clara, Calif.

[21] Appl. No.: 47,790

[22] Filed: Apr. 15, 1993

[51] Int. Cl.⁶ .......................................... H03K 17/22
[52] U.S. Cl. .................................. 327/544; 327/534; 327/594
[58] Field of Search ................. 307/296.3, 246, 491; 365/229; 323/288

[56] References Cited

U.S. PATENT DOCUMENTS

| Re. 31,749 | 11/1984 | Yamashiro | 307/270 |
|---|---|---|---|
| 3,891,936 | 6/1975 | Romeo et al. | 307/311 |
| 4,486,672 | 12/1984 | Nishimura et al. | 307/270 |
| 4,533,839 | 8/1985 | Balakrishnan | 307/270 |
| 4,591,743 | 5/1986 | Kung | 307/270 |
| 4,727,269 | 2/1988 | Luich | 307/310 |
| 4,866,312 | 9/1989 | Kearney et al. | 307/270 |
| 5,089,724 | 2/1992 | Chuang et al. | 307/246 |

OTHER PUBLICATIONS

IBM Technical Disclosure Bulletin, vol. 29, No. 4, Sep. 1986.

Primary Examiner—Timothy P. Callahan
Assistant Examiner—Terry L. Englund
Attorney, Agent, or Firm—Limbach & Limbach; H. Donald Nelson; Vince D. Pitruzzella

[57] ABSTRACT

A quick recovery AC coupling circuit has a coupling capacitor stage that generates an output DC-biased AC signal by capacitively coupling an input DC-biased AC signal generated by a source stage. The output DC-biased AC signal is biased by a biasing stage. The quick recovery AC coupling circuit utilizes an emitter follower which is biased at its emitter by an active device in both the source stage and the biasing stage to maintain the bias voltage across the coupling capacitor stage when the quick recovery AC coupling circuit is powered off and when a high-input impedance device is connected to receive the output DC-biased AC signal.

8 Claims, 5 Drawing Sheets

QUICK RECOVERY AC COUPLING CIRCUIT

BACKGROUND OF THE INVENTION

1. Field of the Invention

The present invention relates to AC coupling capacitors and, in particular, to a circuit for maintaining the bias voltage across a coupling capacitor when power has been removed.

2. Description of the Related Art

Many battery-powered or low-powered electronic circuits are only required to operate for short periods of time and are, therefore, typically turned off when their operation is not required. In some applications, a significant period of time may elapse between each required operation.

When a low-powered circuit includes a DC-biased AC coupling capacitor, care must be taken to insure that once turned off, the circuit will be ready to perform its required operation as soon as the circuit is turned back on again. With a DC-biased AC coupling capacitor, DC bias voltages generated by the circuit control the charge on the capacitor.

Often when a circuit is powered down, there is a change in the DC bias voltages generated by the circuit. Thus, when the DC bias voltages change, the charge stored on the coupling capacitor also changes. Therefore, when the circuit is powered back on, a substantial charge recovery time may be required to restore the original charge. Ideally, any required charge recovery time should be very short, thereby permitting the circuit to be powered on just prior to performing its required operation.

FIG. 1 shows a schematic diagram of a conventional low-powered circuit 10 which illustrates the operation of a DC-biased AC coupling capacitor. As shown in FIG. 1, circuit 10 includes a coupling capacitor stage 12 that passes a pair of output differential DC-biased AC signals Vout+ and Vout− in response to a pair of input differential DC-biased AC signals Vin+ and Vin− and a DC bias voltage Vb.

Circuit 10 also includes a source stage 14 that generates the input AC signals Vin+ and Vin−. The input AC signals Vin+ and Vin− are generated at the emitters of transistors Q3 and Q4, respectively, in response to a pair of intermediate differential DC-biased AC signals Vm+ and Vm− received at the bases of transistors Q3 and Q4. Transistors Q3 and Q4, which function as emitter followers, reproduce the intermediate AC signals Vm+ and Vm− at the emitters of transistors Q3 and Q4, respectively, with only a change in the DC bias level.

The intermediate AC signals Vm+ and Vm− are formed by combining a pair of externally-generated differential AC signals, introduced into circuit 10 by signal generators A1 and A2, respectively, with a signal bias voltage Vs. The signal bias voltage Vs is generated at node N1 in response to a collector current Ic2 sunk by transistor Q2 through resistor R2.

Circuit 10 further includes a biasing stage 16 that generates the DC bias voltage Vb. In operation, the output AC signals Vout+ and Vout− are DC biased by the DC bias voltage Vb. The bias DC voltage Vb is generated at the emitter of transistor Q6 in response to an intermediate voltage Vi received at the base of transistor Q6. Transistor Q6, which also functions as an emitter follower, reproduces the intermediate voltage Vi at the emitter of transistor Q6 with only a change in the DC bias level. As shown in FIG. 1, the intermediate voltage Vi is generated in response to the simple voltage divider formed by resistors R6 and R9.

When switches SW1 and SW4 are closed and switches SW2 and SW3 are open, thereby powering on circuit 10, a bias voltage exists across capacitors C1 and C2 as a result of the DC bias of the input AC signals Vin+ and Vin− and the DC bias voltage Vb. When switches SW1 and SW4 are open, thereby powering off circuit 10, current no longer flows in resistors R1, R2, R6 and R9. The voltage at node N1 drops towards ground as does the voltage at nodes N4 and N5. Consequently, the current in transistors Q3 and Q4 drops to zero, thereby powering off circuit 10.

FIG. 2 shows a schematic diagram of a circuit which is electrically equivalent to circuit of FIG. 1 in a powered off condition. As shown in FIG. 2, in the powered off condition, the bias voltage across capacitors C1 and C2 bleeds off because resistors R3, R4, R5, R7 and R8 are effectively connected across capacitors C1 and C2. Recovery from the powered off condition requires that the lost charge on capacitors C1 and C2 be restored. The amount of time required for this recovery depends on how much charge was lost and the value of the RC time constant.

In the past, some designs have attempted to reduce this recovery time by temporarily reducing the R of the RC time constant. As shown in FIG. 1, this technique is implemented by using switches SW2 and SW3. During the recovery time switches SW2 and SW3 are closed. The recovery time of capacitors C1 and C2 is then limited by the sink and source capabilities of transistors Q3, Q4, and Q6, and the real world resistance of switches SW2 and SW3.

These real world constraints place a lower limit on the recovery time using this technique. Furthermore, a switch control circuit (not shown), which adds complexity and power dissipation to the design, is required to open and close switches SW2 and SW3. Thus, there is a need for a circuit which maintains the bias voltage across a coupling capacitor during a powered off condition, thereby eliminating the charge recovery time.

SUMMARY OF THE INVENTION

The present invention provides a quick recovery AC coupling circuit that utilizes emitter follower circuitry to maintain a bias voltage across a coupling capacitor when the circuit is connected to a high-input impedance device, such as an operational amplifier, and when the circuit is powered off. Consequently, when the circuit is powered back on, the coupling capacitor will already have the correct charge and no time needs to be spent re-acquiring the correct charge. Thus, the recovery time from the power down condition is much faster and much easier to implement.

A quick recovery AC coupling circuit in accordance with the present invention includes a coupling capacitor stage that generates an output DC-biased AC signal in response to an output DC bias voltage and an input DC-biased AC signal. A low-output impedance source stage generates the input DC-biased AC signal in response to an externally-generated AC signal when the circuit is powered on and prevents a first current from flowing from the coupling capacitor stage into the source stage when the circuit is powered off. A biasing stage generates the output DC-bias voltage when the circuit is powered on and prevents a second current from flowing from the coupling capacitor stage into the bias stage when the circuit is powered off.

In operation, when a high-input impedance device is connected to receive the output DC-biased AC signal and when the circuit is powered off, current cannot flow into or out of the coupling capacitor stage. Since current cannot flow into or out of the coupling capacitor stage, the bias voltage across the coupling capacitor stage is thereby maintained.

The source stage can include, for example, a first output substage, a first DC bias substage, and an AC signal substage. The first output substage generates the input DC-biased AC signal in response to an intermediate DC-biased AC signal when the circuit is powered on and prevents the first current from flowing from the coupling capacitor stage into the first output substage when the circuit is powered off. The first DC bias substage generates a signal DC bias voltage that sets the DC bias voltage for the intermediate DC-biased AC signal when the circuit is powered on. The AC signal substage generates the intermediate DC-biased AC signal by combining the externally-generated AC signal and the signal DC bias voltage.

The biasing stage can include, for example, a second output substage and a second DC bias substage. The second output substage generates the output DC bias voltage in response to an intermediate bias voltage when the circuit is powered on and prevents the second current from flowing from the coupling capacitor stage into second output substage when the circuit is powered down. The second DC bias substage generating the intermediate bias voltage when the circuit is powered on.

A better understanding of the features and advantages of the present invention will be obtained by reference to the following detailed description and accompanying drawings which set forth an illustrative embodiment in which the principles of the invention are utilized.

DETAILED DESCRIPTION

Figure 1:
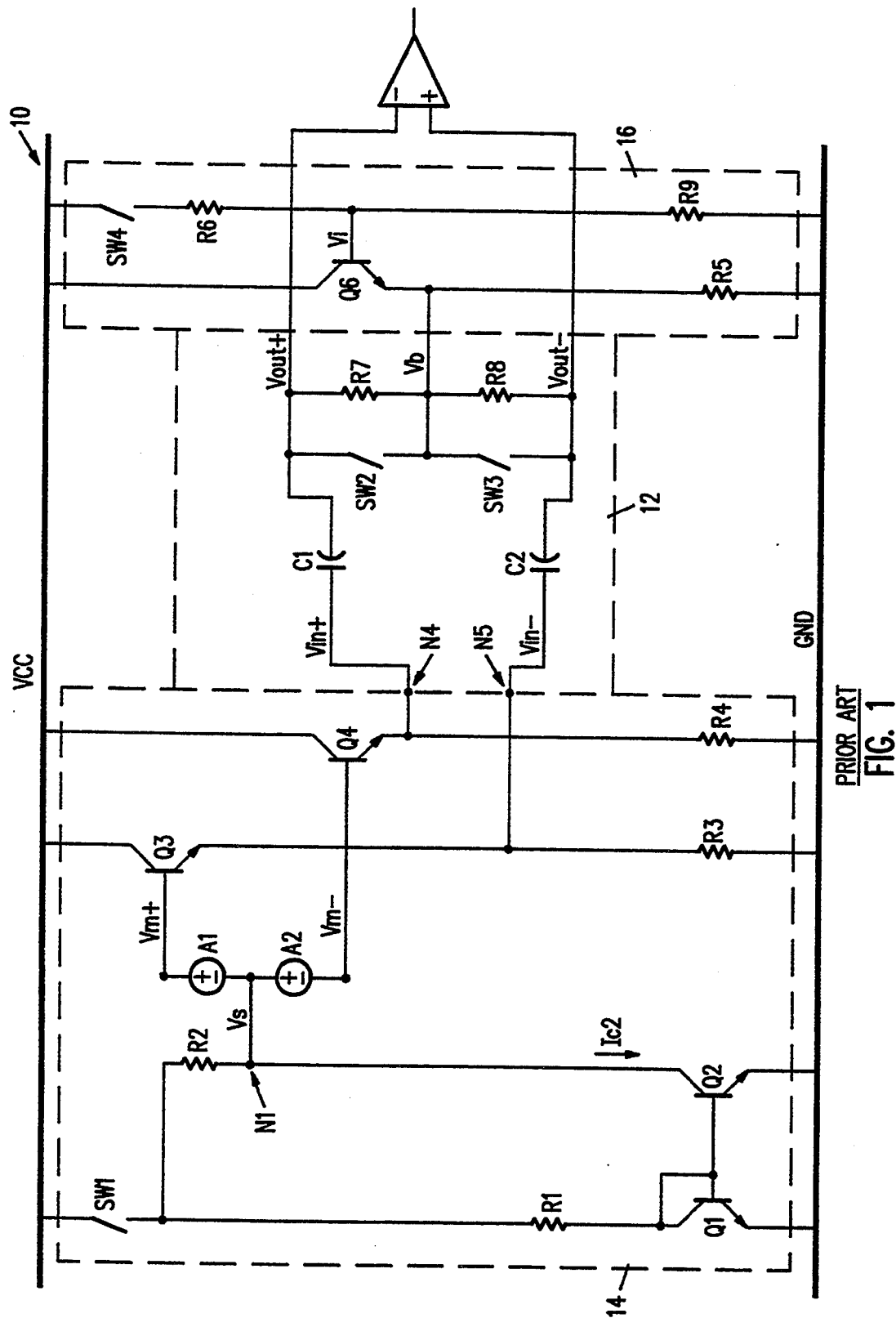
FIG. 1 is a schematic diagram illustrating a conventional low-powered circuit 10 illustrating the operation of a DC-biased AC coupling capacitor.
Figure 2:
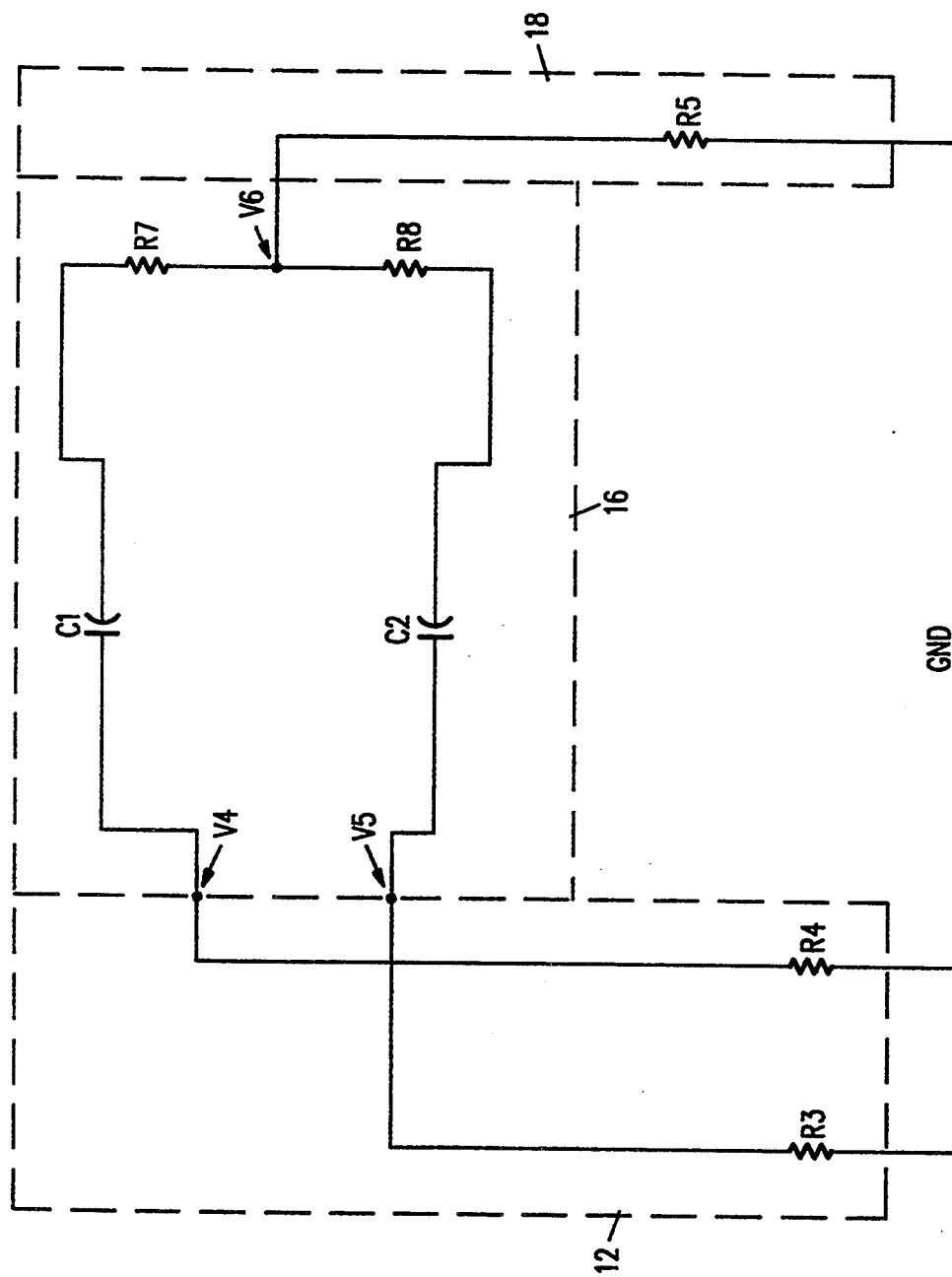
FIG. 2 is a schematic diagram illustrating a circuit which is electrically equivalent to the circuit of FIG. 1 in a powered off condition.
Figure 3:
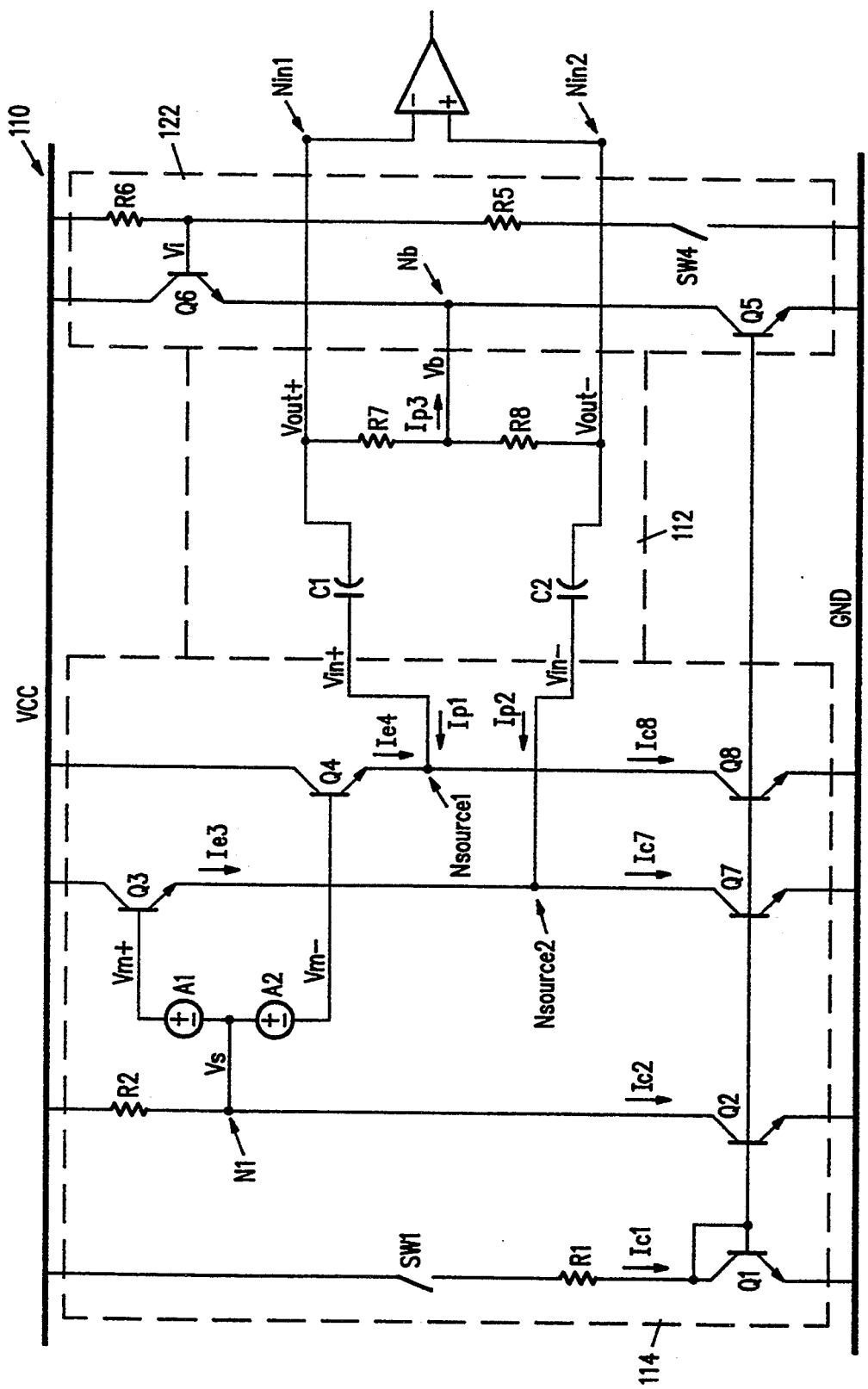
FIG. 3 is a schematic diagram illustrating a quick recovery AC coupling circuit in accordance with the present invention.

FIG. 3 shows a schematic diagram of a quick recovery AC coupling circuit 110 in accordance with the present invention. As described in greater detail below, circuit 110 utilizes an emitter follower which is biased at its emitter by an active device in both a source stage and a biasing stage to prevent current from flowing from an AC coupling capacitor stage into the source stage and the biasing stage when circuit 110 is powered off. Thus, when the output of the AC coupling capacitor stage is connected to a high-input impedance device, such as an operational amplifier, the DC voltage across the AC coupling capacitor stage will remain substantially constant due to the lack of a current path.

As shown in FIG. 3, circuit 110 includes an AC coupling capacitor stage 112 that generates a pair of output differential DC-biased AC signals Vout+ and Vout− in response to a pair of input differential DC-biased AC signals Vin+ and Vin− and an output DC bias voltage Vb. Coupling capacitor stage 112 includes AC coupling capacitors C1 and C2 and resistors R7 and R8.

Capacitor C1 has one plate connected to a source node Nsource1 and the remaining plate connected to an input node Nin1. Similarly, capacitor C2 has one plate connected to a source node Nsource2 and the remaining plate connected to an input node Nin2. Resistor R7 is connected between the input node Nin1 and a bias node Nb while resistor R8 is connected between input node Nin2 and the bias node Nb.

The value of AC coupling capacitors C1 and C2 is dependent on the frequency of the signal(s) to be passed and the value of the input resistance that the AC coupling capacitor is driving. Typically the RC time constant of the AC coupling capacitor, formed by combining capacitor C1 with resistor R7 and capacitor C2 with resistor R8, and the input resistance is kept at least a factor of 10 times lower than the lowest frequency to be passed. A large RC time constant is desirable in order to minimize any signal distortion or signal loss that might occur.

Referring again to FIG. 3, circuit 110 further includes a low-output impedance source stage 114 that generates the pair of input AC signals Vin+ and Vin− when circuit 110 is powered on and that prevents currents Ip1 and Ip2 from flowing from coupling capacitor stage 112 into source stage 114 when circuit 110 is powered off.

Figure 4:
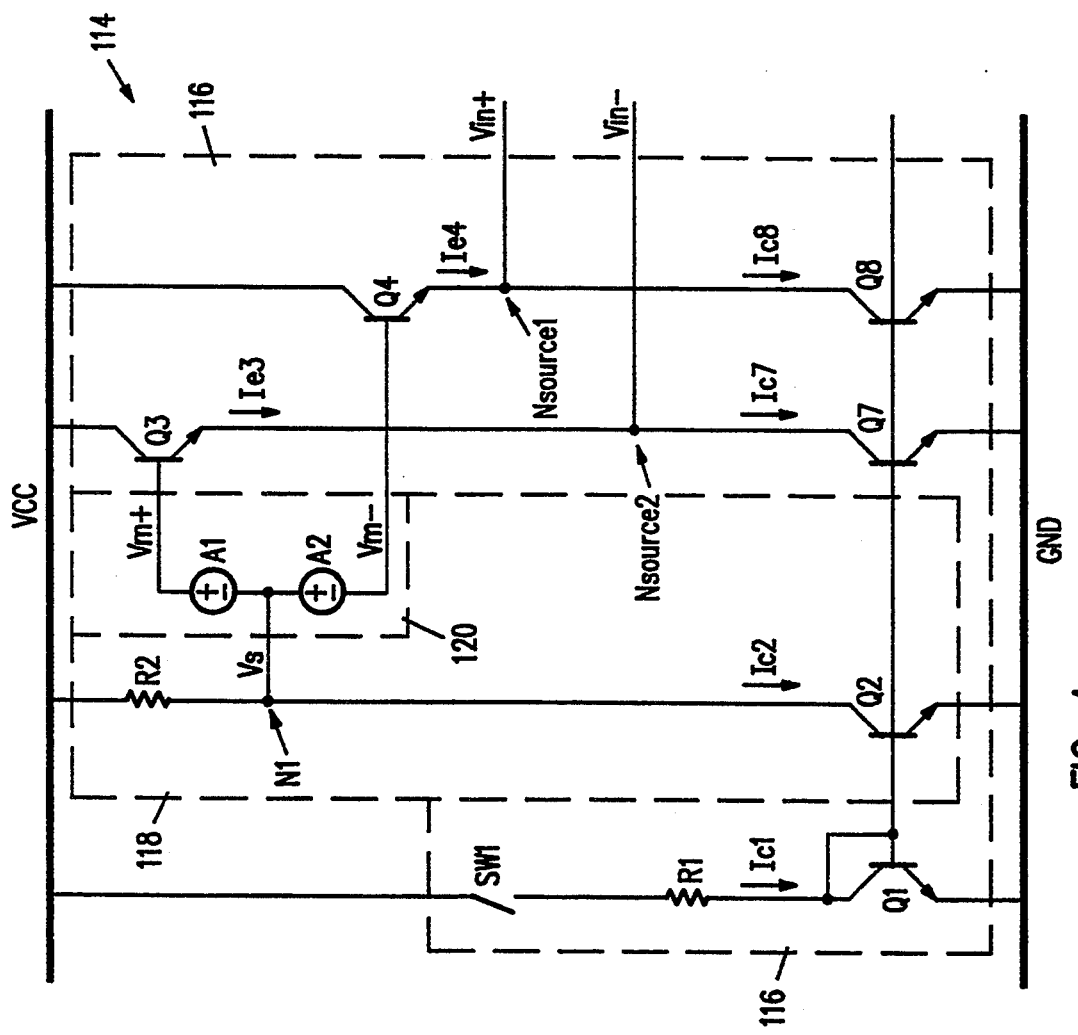
FIG. 4 is a schematic diagram illustrating a source stage of the quick recovery AC coupling circuit.

FIG. 4 shows a schematic diagram of source stage 114. As shown in FIG. 4, source stage 114 includes an output substage 116 that generates the pair of input AC signals Vin+ and Vin− in response to a pair of intermediate differential DC-biased AC signals Vm+ and Vm− when circuit 110 is powered on and that prevents the first current from flowing from coupling capacitor stage 112 into output stage 116 when circuit 110 is powered off. As shown in FIG. 4, output substage 116 includes NPN transistors Q1, Q3, Q4, Q7, and Q8.

Transistor Q3 has its emitter connected to source node Nsource2, its base connected to the intermediate AC signal Vm+, and its collector connected to a power supply VCC. Transistor Q4, which is formed to be substantially identical to transistor Q3, has its emitter connected to source node Nsource1, its base connected to the intermediate AC signal Vm−, and its collector connected to the power supply VCC.

Transistor Q7 has its emitter connected to ground GND, its base connected to the base of transistor Q1, and its collector connected to the emitter of transistor Q3. Transistor Q8, which is formed to be substantially identical to transistor Q7, has its emitter connected to ground GND, its base connected to the base of transistor Q1, and its collector connected to the emitter of transistor Q4.

Transistors Q3 and Q4 are configured to operate as emitter followers which are biased by the DC bias voltage of the intermediate AC signals Vm+ and Vm− to operate in the active region. In a steady-state condition, transistors Q3 and Q4 generate emitter currents Ie3 and Ie4, respectively, which are sunk by transistors Q7 and Q8, respectively, as collector currents Ic7 and Ic8, respectively.

When the AC signal is added, transistors Q3 and Q4 will source a greater or a lesser emitter current, as required, to force the voltage at the emitters of transistors Q3 and Q4 to follow the voltage at the bases of transistors Q3 and Q4, respectively, minus the voltage across the base-emitter junction. Referring again to FIG. 3, since capacitors C2 and C1 are connected to the emitters of transistors Q3 and Q4, respectively, transistors Q3 and Q4 will also force the voltage across capacitors C2 and C1, respectively, to follow the voltages at the bases of transistors Q3 and Q4, respectively, minus the voltage across the base-emitter junction.

For example, when the total voltage of the intermediate AC signal Vm+ exceeds the DC bias voltage, the voltage across the base-emitter junction of transistor Q3 will be increased, thereby causing transistor Q3 to increase the magnitude of current Ie3. Since the current Ie3 now exceeds the magnitude of current Ic7, the excess current is sourced to capacitor C2, thereby charging capacitor C2. As capacitor C2 charges, the voltage across the base-emitter junction is reduced, thereby reducing the magnitude of the current Ie3.

On the other hand, when the total voltage of the intermediate AC signal Vm+ falls below the DC bias voltage, the voltage across the base-emitter junction of transistor Q3 is reduced, thereby causing transistor Q3 to reduce the magnitude of current Ie3. Since the current Ie3 is now less than the magnitude of current Ic7, the current required to satisfy transistor Q7 is sunk from capacitor C2, thereby discharging capacitor C2.

Thus, when circuit 110 is powered on, transistors Q3 and Q4 will force the voltage at their emitters, and thereby the voltage across capacitors C2 and C1, respectively, to follow the voltage at their bases, minus the voltage across their base-emitter junctions.

Referring again to FIG. 4, the collector currents Ic7 and Ic8 sunk by transistors Q7 and Q8, respectively, mirror a collector current Ic1 which is sunk by transistor Q1. Transistor Q1 has its emitter connected to ground GND and both its base and collector connected to the power supply VCC through serially-connected resistor R1 and first switch SW1.

When circuit 110 is powered off, transistors Q7 and Q8 turn off. With transistors Q7 and Q8 turned off, current cannot flow from capacitors C2 and C1, respectively, through transistors Q7 and Q8. In addition, current cannot flow into the emitters of transistors Q3 and Q4 which, when power is removed, function as reverse-biased diodes. Thus, when powered off, output substage 116 prevents current from flowing from the coupling capacitor stage 112 into the source stage 114.

Referring again to FIG. 4, source stage 114 also includes a DC bias substage 118 that generates a signal DC bias voltage Vs that sets the DC bias voltage for the pair of intermediate AC signals Vm+ and Vm−, and an AC signal substage 120 that generates the pair of intermediate AC signals Vm+ and Vm− by combining a pair of externally-generated differential AC signals with the signal bias voltage Vs.

The DC bias substage 118 includes NPN transistor Q2 and resistor R2. Transistor Q2, which is formed to be substantially equivalent to transistor Q1, has its emitter connected to ground, its base connected to the base of transistor Q1, and its collector connected to a first node N1. Resistor R2 is connected between the first node N1 and the power supply VCC.

Transistors Q1 and Q2 are also configured as a current mirror. Thus, when circuit 110 is powered on, transistor Q2 sinks a collector current Ic2 which is equivalent to the collector current Ic1 sunk by transistor Q1. In operation, the collector current Ic2 is sunk through resistor R2 which sets the signal DC bias voltage Vs at the first node N1.

As shown in FIG. 4, AC signal substage 120 includes AC signal generators A1 and A2 which represent the introduction of the pair of externally-generated differential AC signals into circuit 110. Signal generator A1 has its negative node connected to the first node N1 and its positive node connected to base of transistor Q3. Inversely, AC signal generator A2 has its positive node connected to the first node N1 and its negative node connected to the base of transistor Q4.

In operation, AC signal generator A1 generates the intermediate AC signal Vm+ at the base of transistor Q3 with a DC bias voltage which is defined by the signal DC bias voltage Vs at the first node N1. Similarly, AC signal generator A2 generates the intermediate AC signal Vm− at the base of transistor Q4 with a DC bias voltage which is also defined by the signal DC bias voltage Vs at the first node N1.

Referring again to FIG. 3, circuit 110 also includes an output biasing stage 122 that generates the output DC bias voltage Vb when circuit 110 is powered on and that prevents a current Ip3 from flowing from coupling capacitor stage 112 into biasing stage 122 when circuit 110 is powered down.

Figure 5:
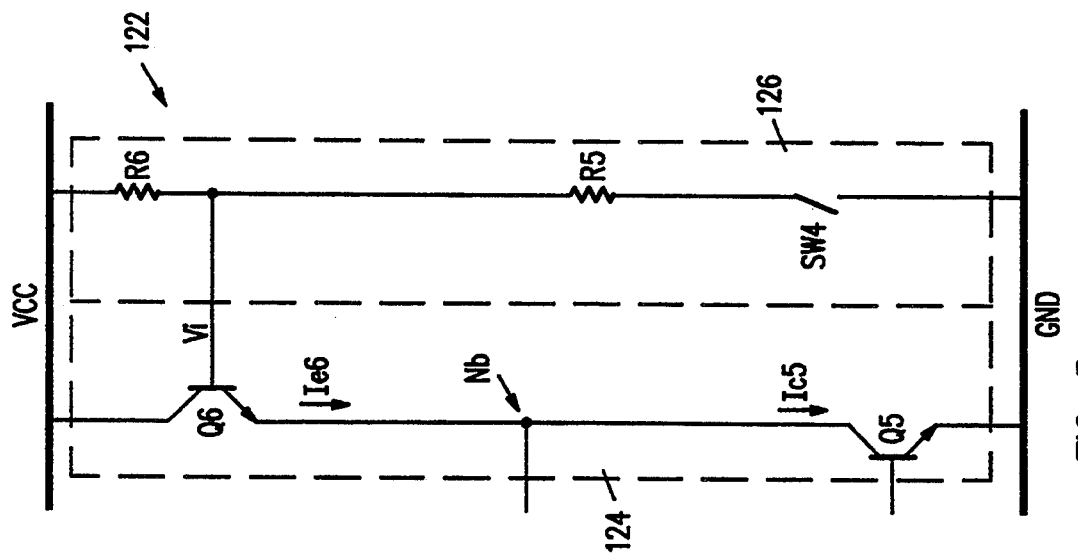
FIG. 5 is a schematic diagram illustrating a biasing stage of the quick recovery AC coupling circuit.

FIG. 5 shows a schematic diagram of biasing stage 122. As shown in FIG. 5, biasing stage 122 includes an output substage 124 that generates the output DC bias voltage Vb in response to an intermediate bias voltage Vi when circuit 110 is powered on and that prevents the current Ip3 from flowing from coupling capacitor stage 112 into output stage 124 when circuit 110 is powered down.

Output stage 124 includes NPN transistors Q5 and Q6. Transistor Q5, which is formed to be substantially equivalent to transistor Q7, has its emitter connected to ground GND, its base connected to the base of transistor Q1, and its collector connected to the bias node Nb. Transistor Q6 has its emitter connected to the bias node Nb, its base connected to the intermediate bias voltage Vi, and its collector connected to the power supply VCC.

Transistor Q6 is also configured to operate as an emitter follower. As stated above, an emitter follower will force the voltage at its emitter to follow the voltage at its base minus the voltage across its base-emitter junction. Thus, the output DC bias voltage Vb at the bias node Nb is defined by the voltage at the base of transistor Q6, minus the voltage across the base-emitter junction of transistor Q6.

In a steady-state condition, transistor Q6 generates an emitter current Ie6 which is sunk by transistor Q5 as a collector current Ic5. When a high-input impedance device, such as an operational amplifier, is connected to the input nodes Nin1 and Nin2, no current will flow through resistors R7 and R8 due to the lack of a current path.

As with transistors Q7 and Q8, when circuit 110 is powered off, transistor Q5 is also turned off. With transistor Q5 turned off, current Ip3 cannot flow from capacitors C1 and C2 through transistor Q5. Further, as with transistors Q3 and Q4, transistor Q6 also functions as a reverse-biased diode when power is removed, thereby preventing current Ip3 from flowing into the emitter of transistor Q6. Thus, when powered off, output stage 124 prevents current Ip3 from flowing from the coupling capacitor stage 112 into the biasing stage 122.

Referring again to FIG. 5, biasing stage 122 also includes a DC bias substage 126 that generates the intermediate bias voltage Vi. As shown in FIG. 5, DC bias substage 126 includes resistors R5 and R6 and a switch SW4. Resistors R5 and R6 are connected as a simple voltage divider which sets the intermediate bias voltage Vi at the base of transistor Q6.

In operation, circuit 110 is powered on by closing switches SW1 and SW4, and is powered off by opening switches SW1 and SW4. In practice, switches SW1 and SW4 could be, for example, MOS devices operating in their resistive or off state.

When circuit 110 is powered down, power is removed from all the active devices including transistors Q7, Q8 and Q5 which, as described above, turn off. The common mode DC voltages at source nodes Nsource1 and Nsource2 and at the bias node Nb move up towards the voltage of the power supply VCC, however, the charge stored on capacitors C1 and C2 is not allowed to increase or decrease.

This fact is best seen by attempting to trace the current path that a bleed current would need to take. As stated above, with transistors Q5, Q7 and Q8 turned off, current cannot flow from capacitors C1 and C2 into transistors Q5, Q7 and Q8. As also stated above, a bleed current cannot flow into the emitters of transistors Q3 and Q4 because, with power removed, both transistors Q3 and Q4 act as reverse biased diodes.

For example, transistor Q3 could source a current into capacitor C2. However, this current would then need to flow either into the emitter of transistor Q6 or through resistors R7 and R8 and capacitor C1 into the emitter of transistor Q4. In either case this current is prevented from flowing as both transistors Q4 and Q6 act as reversed-biased diodes with power removed. A similar arrangement can be made with regard to current sourced from transistor Q4. Once again, this current can neither flow into the emitters of transistors Q3 nor Q6 and therefore can not flow at all.

Since, in the powered down condition, capacitors C1 and C2 can neither be charged or discharged, capacitors C1 and C2 maintain the same charge which was present prior to circuit 110 being powered down. Consequently, when circuit 110 is powered back on, capacitors C1 and C2 already have the correct charge and no time needs to be spent re-acquiring the correct charge. The recovery time from the power down condition is thus much faster and much easier to implement.

Figure 6:
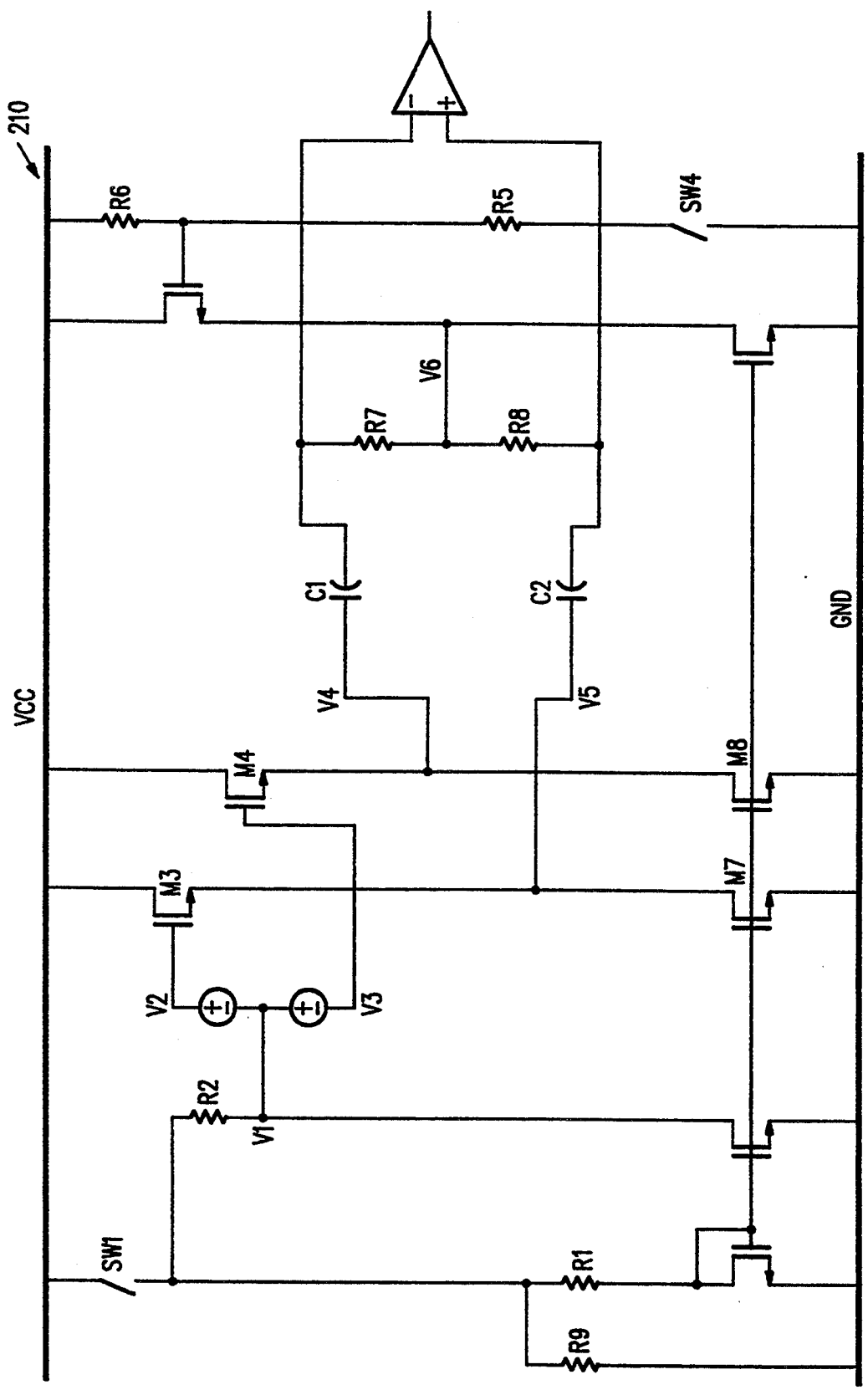
FIG. 6 is a schematic diagram illustrating a quick recovery AC coupling circuit illustrating a MOS transistor implementation of the invention.

FIG. 6 shows a schematic diagram of a quick recovery AC coupling circuit 210 which illustrates a MOS transistor implementation of the invention. Circuit 210 operates as circuit 110 of FIG. 3 operates with one exception. In order to guarantee that capacitors C1 and C2 neither charge or discharge, transistors M3 and M4 must be turned off.

Transistors M3 and M4 are turned off by allowing the gates of transistors M3 and M4 to go to ground when circuit 210 is powered down. When switches SW1 and SW4 are opened and circuit 210 powers down, resistor R9 guarantees that the gate voltage of transistors M3 and M4 go to ground, thereby turning transistors M3 and M4 completely off. With transistors M3, M4, M7, and M8 completely off, there is no current path for capacitors C1 or C2 to be charged or discharged. Thus, circuit 210 will also exhibit a quick recovery from the powered down condition.

It should be understood that various alternatives to the structures described herein may be employed in practicing the present invention. Although the present invention has been described in terms of a pair of capacitors which couple a pair of differential signals to a pair of output nodes, a single capacitor which couples a single ended signal to an output node is equally applicable. Thus, it is intended that the following claims define the invention and that structures within the scope of these claims and their equivalents be covered thereby.

What is claimed is:

1. A quick-recovery AC coupling circuit for maintaining a bias voltage across a coupling capacitor when the circuit is powered off, the circuit comprising:
   a coupling capacitor stage that generates an output DC-biased AC signal at an output node by receiving an output DC bias voltage at a bias node and by capacitively coupling an input DC-biased AC signal at an input node to the output node;
   a low-output impedance source stage that generates the input DC-biased AC signal at the input node to the coupling capacitor stage in response to an externally-generated AC signal and that prevents a first current from flowing from the coupling capacitor stage into the source stage when the circuit is powered off; and
   a biasing stage that generates the output DC-bias voltage at the bias node and that prevents a second current from flowing from the coupling capacitor stage into the biasing stage when the circuit is powered off,
   whereby when a high-input impedance device is connected to the output node and when the circuit is powered off, current cannot flow into or out of the coupling capacitor stage, thereby maintaining the bias voltage across the coupling capacitor stage.

2. The circuit of claim 1 wherein the coupling capacitor stage comprises:
   a capacitor connected between the input node and the output node; and
   a resistor connected between the output node and the bias node.

3. The circuit of claim 2 wherein the source stage comprises:
   a first output substage that generates the input DC-biased AC signal in response to an intermediate DC-biased AC signal when the circuit is powered on and that prevents the first current from flowing from the coupling capacitor stage into the first output substage when the circuit is powered off;
   a first DC bias substage that generates a signal DC bias voltage that sets the DC bias voltage for the intermediate DC-biased AC signal when the circuit is powered on; and
   an AC signal substage that generates the intermediate DC-biased AC signal by combining the externally-generated AC signal and the signal DC bias voltage.

4. The circuit of claim 3 wherein the biasing stage means comprises:
   a second output substage that generates the output DC bias voltage in response to an intermediate bias voltage when the circuit is powered on and that prevents the second current from flowing from coupling capacitor stage into second output stage when the circuit is powered down; and a second DC bias substage that generates the intermediate bias voltage when the circuit is powered on.

5. The circuit of claim 3 wherein the first output substage comprises:

an emitter-follower transistor having its emitter connected to the input node, its base connected to the intermediate DC-biased AC signal, and its collector connected to a power supply; and a current sink transistor having its emitter connected to ground, its base connected to a current mirror voltage, and its collector connected to the input node.

6. The circuit of claim 4 wherein the second output substage comprises:

an emitter-follower transistor having its emitter connected to the bias node, its base connected to the intermediate DC voltage, and its collector connected to a power supply; and a current sink transistor having its emitter connected to ground, its base connected to a current mirror voltage, and its collector connected to the bias node.

7. The circuit of claim 3 wherein the first output substage comprises:

an source-follower transistor having its source connected to the input node, its gate connected to the intermediate DC-biased AC signal, and its drain connected to a power supply; and a current sink transistor having its source connected to ground, its gate connected to a current mirror voltage, and its drain connected to the input node.

8. The circuit of claim 4 wherein the second output substage comprises:

an source-follower transistor having its source connected to the bias node, its gate connected to the intermediate DC voltage, and its drain connected to a power supply; and a current sink transistor having its source connected to ground, its gate connected to a current mirror voltage, and its drain connected to the bias node.

* * * * *